US006828712B2

(12) United States Patent
Battaglin et al.

(10) Patent No.: US 6,828,712 B2
(45) Date of Patent: Dec. 7, 2004

(54) HIGH-EFFICIENCY DRIVER CIRCUIT FOR CAPACITIVE LOADS

(75) Inventors: Luca Battaglin, Castiglione Olona (IT); Pietro Gallina, Carbonate (IT); Giancarlo Saba, Agrate Brianza (IT); Giancarlo Zinco, Broni (IT); Claudio Diazzi, Sesto Calende (IT); Vittorio Peduto, Ivrea (IT)

(73) Assignee: STMicroelectronics, S.r.l., Agrate Brianza (IT)

( * ) Notice: Subject to any disclaimer, the term of this patent is extended or adjusted under 35 U.S.C. 154(b) by 32 days.

(21) Appl. No.: 10/150,548

(22) Filed: May 17, 2002

(65) Prior Publication Data

US 2003/0015938 A1 Jan. 23, 2003

Related U.S. Application Data

(63) Continuation-in-part of application No. PCT/EP01/10776, filed on Sep. 18, 2001.

(30) Foreign Application Priority Data

Sep. 19, 2000 (IT) ..................................... MI2000A2044

(51) Int. Cl.[7] .............................................. H01L 41/08
(52) U.S. Cl. .................................. 310/317; 310/316.01
(58) Field of Search ....................... 310/316.01, 316.07, 310/316.03, 317, 319; 318/116–118

(56) References Cited

U.S. PATENT DOCUMENTS

| | | | | |
|---|---|---|---|---|
| 4,284,996 A | * | 8/1981 | Greve | ........................... 347/11 |
| 4,498,089 A | * | 2/1985 | Scardovi | ....................... 347/10 |
| 5,053,668 A | * | 10/1991 | Mitsuyasu | ................... 310/317 |
| 5,109,174 A | * | 4/1992 | Shewell | ....................... 310/317 |
| 5,130,598 A | * | 7/1992 | Verheyen et al. | ...... 310/316.03 |
| 5,631,605 A | * | 5/1997 | Bailly | ......................... 330/146 |
| 5,994,929 A | | 11/1999 | Sano et al. | |
| 6,417,598 B2 | * | 7/2002 | Grehant | ................. 310/316.01 |

FOREIGN PATENT DOCUMENTS

EP          1 006 656 A2    7/2000

OTHER PUBLICATIONS

V. Nesterov, R. Cassel High Current Transistor Pulse Generator Conference Record of the 1991 *IEEE Nuclear Science Symposium and Medical Imaging Conference* Nov. 2–9, 1991 vol. 2 of 3 Santa Fe, New Mexico USA.

* cited by examiner

*Primary Examiner*—Mark Budd
(74) *Attorney, Agent, or Firm*—Lisa K. Jorgenson; Bryan A. Santarelli; Graybeal Jackson Haley LLP

(57) ABSTRACT

A circuit for driving capacitive loads in a highly efficient manner. In one embodiment, a drive portion is connected to at least one end of a capacitive electric load being applied a voltage waveform. The embodiment further comprises a switching circuit portion having its output connected to the above one end of the capacitive load in order to supply a fraction of the overall current demanded by the load. Additionally, a switching circuit and accompanying switching method provide for efficiently supplying peak current to the capacitive load during voltage fluctuation in the voltage waveform. Briefly, the invention is a circuit arrangement aimed at providing a highly efficient drive for the capacitive load, using a combined linear/switching setup and without distorting the quality of the waveform generated across the capacitive load.

35 Claims, 7 Drawing Sheets

US 6,828,712 B2

HIGH-EFFICIENCY DRIVER CIRCUIT FOR CAPACITIVE LOADS

CROSS-REFERENCE TO RELATED APPLICATIONS

This is a continuation-in-Part of co-pending International Application PCT/EP01/10776 filed on Sep. 18, 2001 and IT MI2000A 002044 filed on Sep. 19, 2000 designating the United States.

TECHNICAL FIELD

The present invention relates to a high-efficiency driver circuit for capacitive loads, which circuit comprises a drive portion connected to at least one end of a capacitive electric load being applied a voltage waveform. The invention relates, particularly but not exclusively, to a driver circuit for a piezoelectric type of a printer head, this description making reference to this field of application for convenience of illustration only.

BACKGROUND OF THE INVENTION

As is well known in this technical field, the electric characteristic of a comprehensive class of transducers, such as those described in U.S. Pat. No. 5,895,998, can be likened to a capacitive load. The piezoelectric heads of printers may also be viewed as capacitive loads. These printer heads are driven by applying a voltage waveform across their terminals. The waveform typically consists of a succession of linear edges. An example of this is to be found in U.S. Pat. No. 4,767,959 granted to Nippondenso Co.

The high degree of accuracy necessary in applying said voltage waveform to the capacitive load, along with the high frequency of the drive signal, has led to the use of linear-mode driver circuits, involving high power dissipation even though the load itself may be a non-dissipative one. FIG. 1 is an example of prior art wherein a linear drive is used for applying a voltage waveform to a capacitive element.

It should be emphasized that the capacitive load is a non-dissipative type, and that all the electric power is dissipated through the transistors that comprise the linear drive stage. Thus, the efficiency of this conventional approach is poor because of the large amount of power that is dissipated through the transistors. The technical problem that underlies this invention is to provide a driver circuit, particularly for capacitive loads, with appropriate structural and functional features for the load to be driven with high efficiency and without distorting the quality of the waveform generated across the capacitive load.

BRIEF SUMMARY OF THE INVENTION

An embodiment of the present invention relates to a high-efficiency driver circuit for capacitive loads, whereby a voltage waveform formed by a succession of linear edges can be applied to a capacitive load using a combined switching and linear drive technique. The embodiment comprises: (1) an electronic circuit for applying a voltage waveform to a capacitive load, (2) a switching circuit connected to the capacitive load for supplying a fraction of current demanded by the capacitive load, and (3) a control circuit for controlling the switching circuit. Typically, the switching circuit comprises a transistor bridge powered between a first voltage reference and a second voltage reference having an inductor between the bridge nodes.

Features and advantages of a circuit according to the invention are made apparent by the following description of an embodiment thereof, given by way of non-limitative example with reference to the accompanying drawings.

DETAILED DESCRIPTION OF THE PREFERRED EMBODIMENT

Figure 1:
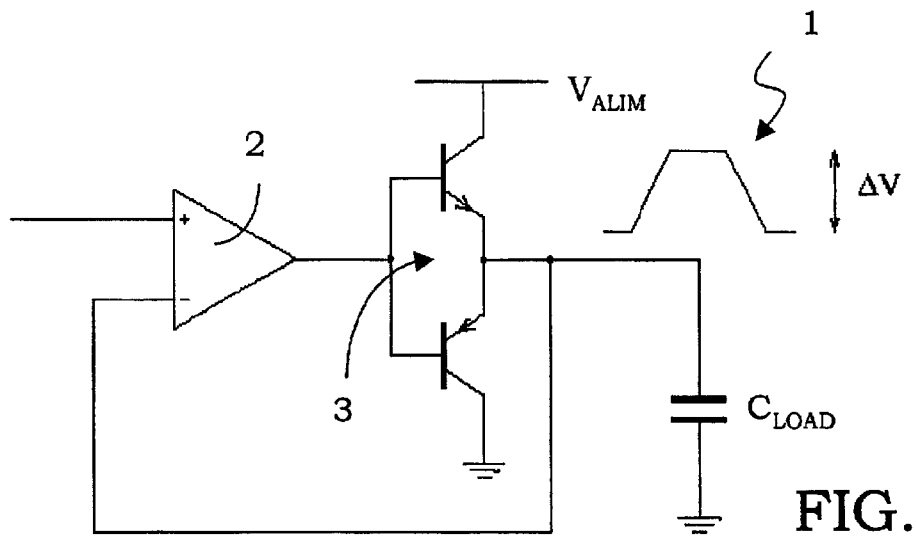
FIG. 1 is a schematic diagram of a capacitive load-driving circuit according to the prior art.
Figure 2:
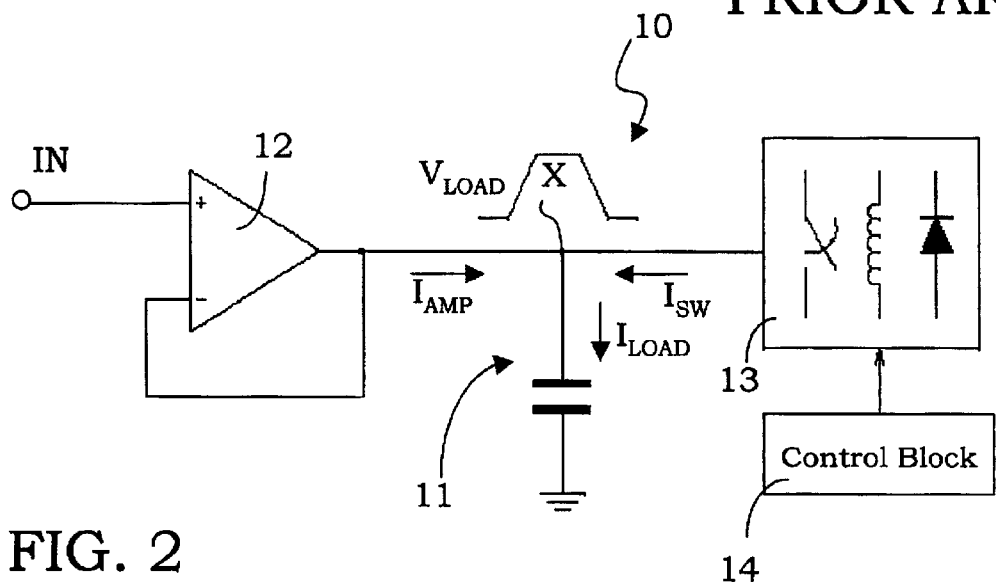
FIG. 2 is a schematic diagram of a capacitive load-driving circuit according to an embodiment of the invention.

With reference to the drawings, in particular to the embodiment as shown in FIG. 2, a driver circuit according to an embodiment of this invention for driving a capacitive electric load 11 is shown generally at 10 in schematic form.

The circuit 10 comprises an operational amplifier 12 having its output fed back to its inverting input and further connected to one end of the load 11 (node X) to deliver a current $I_{AMP}$. The non-inverting input of the amplifier 12 receives a control signal from an input terminal IN of the circuit 10. This amplifier 12 may be regarded as an important component of the linear portion in the circuit 10. The circuit 10 of FIG. 2 further comprises a switching circuit portion 13 having its output connected to the capacitive load 11 to deliver a current $I_{SW}$. Additionally, a control block 14 is provided to drive the switching circuit portion 13.

Figure 3:
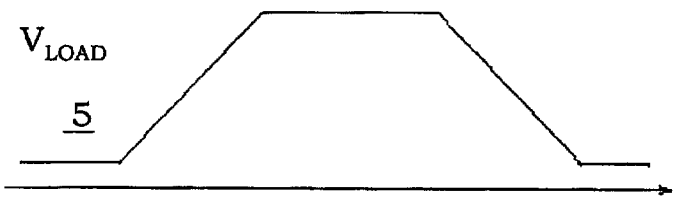
FIG. 3 is a comparative graph of the waveform of current draw by the load and voltage to the load.
Figure 3:
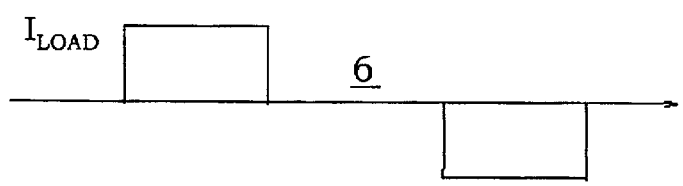

The system, circuit and method of this embodiment of the invention are directed toward providing current for a capacitive load to be driven with high efficiency by a combined linear/switching setup, at no loss of quality of the waveform generated across the capacitive load 11. Advantageously, the switching circuit portion 13 functions to supply, with high efficiency, a major fraction of the overall current draw by the load 11, while the linear circuit portion 12 assures accuracy for the voltage waveform and supplies only the difference in current, thus saving much power. The linear circuit portion 12 is to meet band and slew-rate requirements of the signal to be reproduced on the load. FIG. 3 shows, by way of example, the waveform of the current drawn by the capacitive load (curve 6), against a voltage waveform applied to the load (curve 5).

Figure 4:
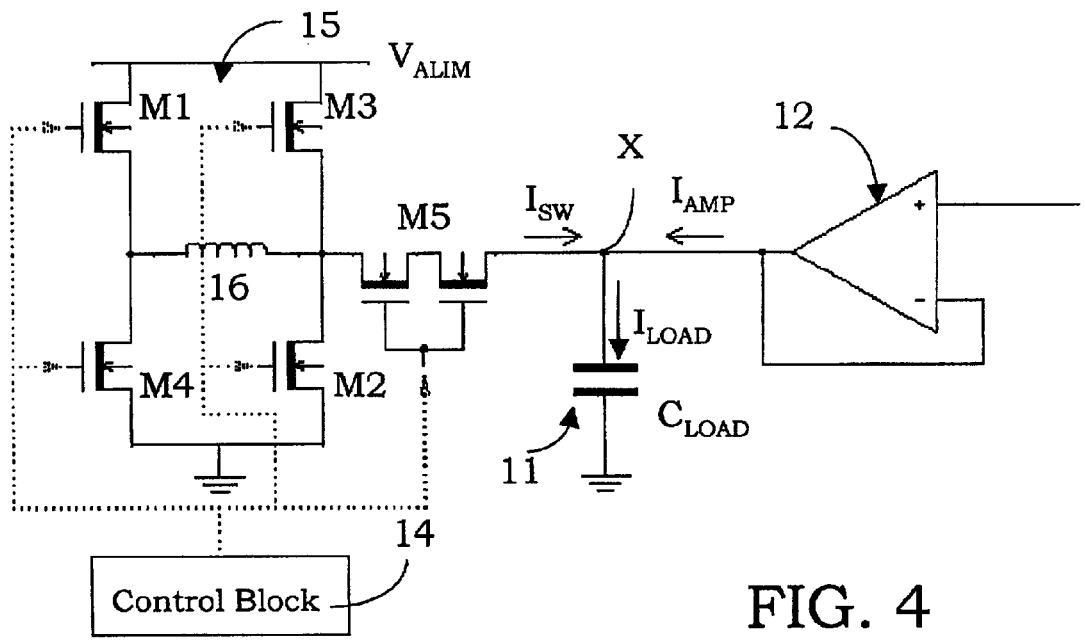
FIG. 4 shows schematically one embodiment of a part of the FIG. 2 circuit.

Referencing FIG. 4, to fill the demand for current by the load, the switching portion of the circuit 10 is provided with a bridge circuit 15 of transistors M1, M2, M3 and M4, wherein the transistors are interconnected into a highly efficient full-bridge arrangement. The bridge 15 is powered between a first or supply voltage reference $V_{ALIM}$ and a second or ground reference GND. An inductor 16 is connected between two opposed nodes of the bridge 15.

Although in the preferred embodiment of the invention being described herein by way of non-limitative example, the bridge 15 comprises MOS power transistors, a bipolar transistor bridge could be used instead. The bridge circuit 15 is coupled to the load 11 through a two-way switch M5. The control terminals of the transistors M1, M2, M3 and M4 in the bridge circuit 15 are all connected to the control block 14, also having an output connected to the switch M5. The control block 14 acts on the transistors of the bridge 15 to produce a current profile as close as possible to the sought profile. For this reason, the control block 14 needs information about the duration, slew rate of the ramp, and value of a load $C_{LOAD}$.

Figure 5:
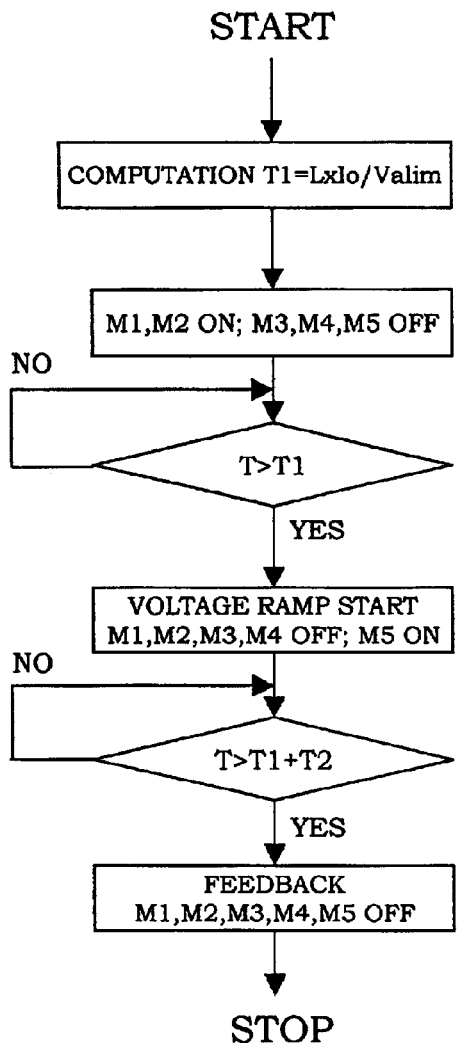
FIG. 5 is a flow chart illustrating sequentially one mode of operating a part of the circuit according to an embodiment of the invention.

Shown schematically in the flow chart of FIG. 5 is a succession of steps illustrating the operation of the control block 14 during an upward ramp of the voltage $V_{LOAD}$. A first amount of time is determined by calculating the product of the inductance of the inductor in the bridge circuit and the supply voltage reference for the bridge circuit. This time period is the amount of time required to charge the inductor in order to provide the requisite peak current for the capacitive load. During the T1 time period, M1 and M2 are on creating a current path between the supply voltage and the ground to charge the inductor. During this time, M3, M4 and M5 are off. Once T1 has been reached, M1 and M2 turn off and M5 turns on which creates a current path for the inductor to discharge current to the capacitive load. After another calculated time period T2, the current path to the capacitive load is broken as M5 turns back off. The remaining current stored in the inductor then dissipates back to the supply voltage within the bridge circuit.

Figure 6:
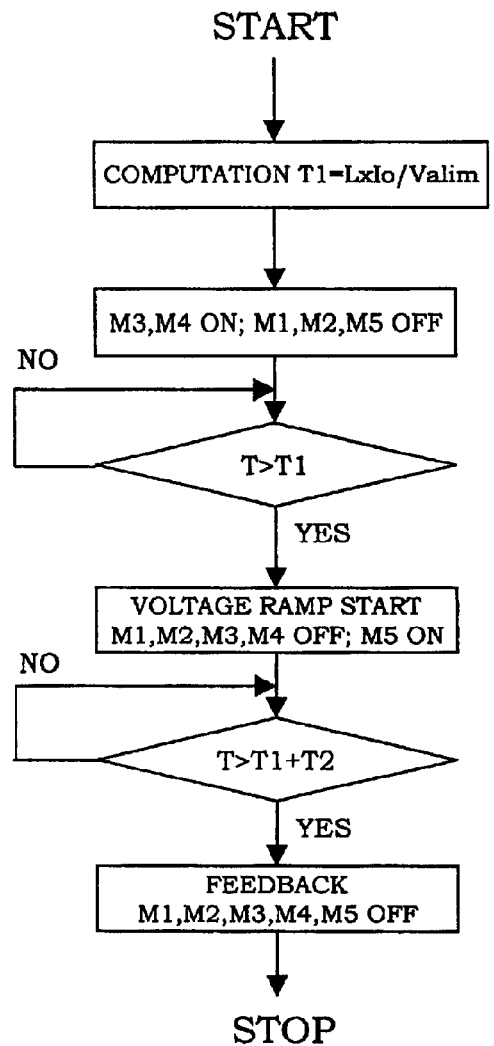
FIG. 6 is another flow chart illustrating sequentially another mode of operating a part of the circuit according to an embodiment of the invention.

The flow chart of FIG. 6 likewise shows in schematic form a succession of steps illustrating the operation of the control block 14 during a downward ramp of the voltage $V_{LOAD}$. The operation is identical to the previous example except that the transistors M1, M2, M3, and M4 act in the opposite fashion respectively.

Figure 7:
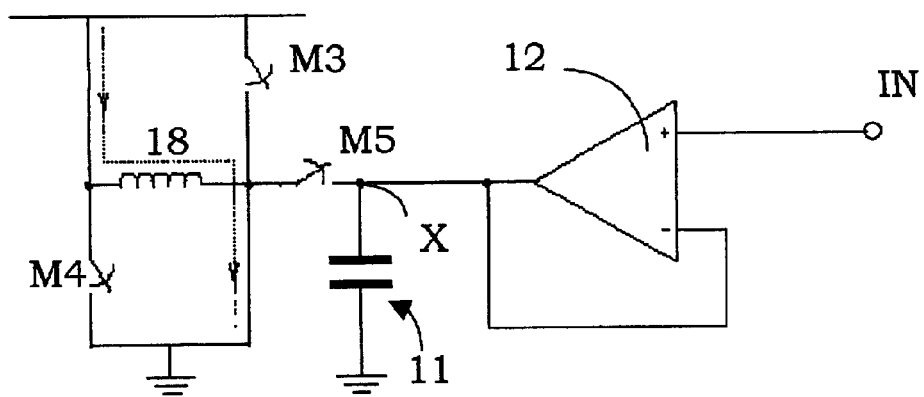
FIGS. 7, 8 and 9 are respective diagrams of the circuit shown in FIG. 3 at three different stages of its operation.
Figure 8:
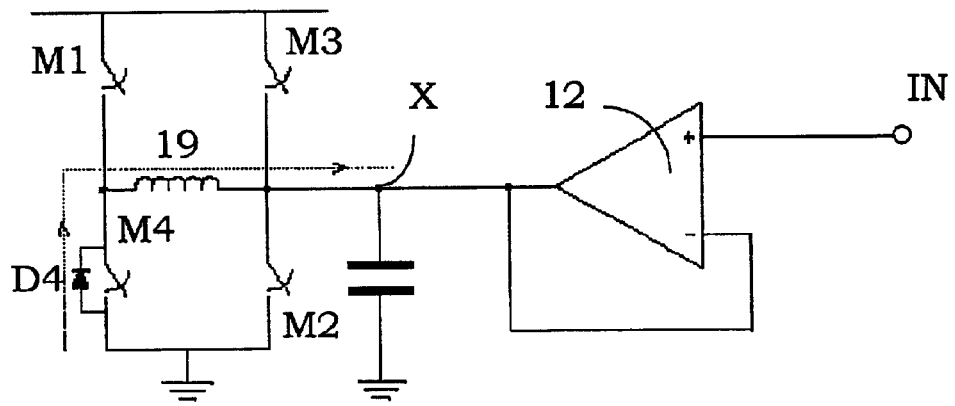
Figure 9:
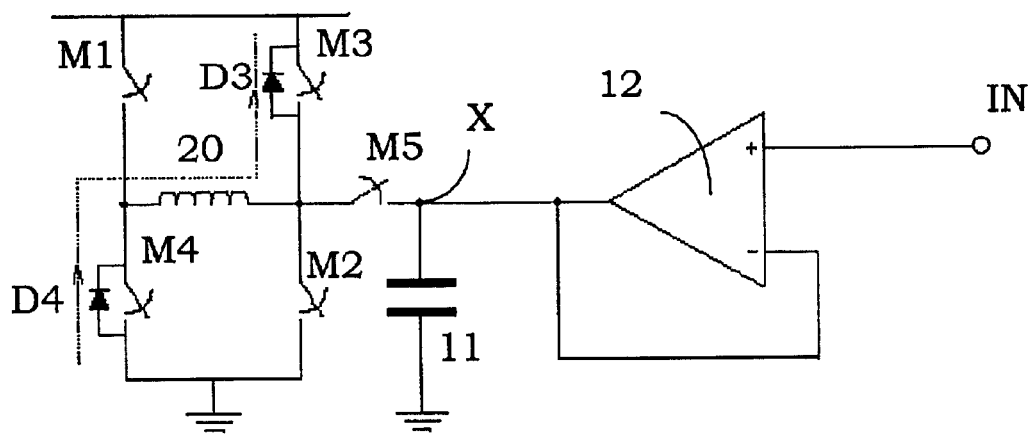

Let us see now, in greater detail, the operation of the circuit 10 according to an embodiment of the invention, with reference to the diagrams of FIGS. 7, 8, 9 and in a situation of an upward ramp at the load 11. The process steps may be divided into three discrete phases, as specified here below.

1. Pre-charging Phase T1. Since the current value required at the start of the ramp is other than zero, the inductor 16 must be pre-charged to the required value a time period Ti ahead of the ramp start, and by closing two transistors, M1 and M2, of the bridge 15. During this phase, the other transistors M3, M4 and M5 are open. The current flow is represented by the dot-line curve 18.

2. Ramp Phase T2. Transistors M1 and M2 are opened and switch M5 is closed at the foot of the ramp. Thus, the current is released to the load through an intrinsic diode D4, shown in FIG. 7, which is associated with transistor M4, as well as through the switch M5. During this phase, the inductor 16 is partly, or perhaps fully depleted of its initial current, and the amplifier 12 acts to provide the output voltage waveform by means of a current $I_{AMP}$ being equal to the difference between the current $I_{LOAD}$ demanded by the load and that $I_{SW}$ supplied from the bridge 15. The current flow is represented by the dot-line curve 19.

3. Loop-back Phase T3. Switch M5 is opened at the ramp end, and any current left in the inductor 16 is allowed to loop back through respective intrinsic diodes D3, D4 associated with the transistors M3 and M4, thus returning a major fraction of the residual energy stored in the inductor 16 to the power supply. The current flow is represented by the dot-line curve 20.

Figure 10:
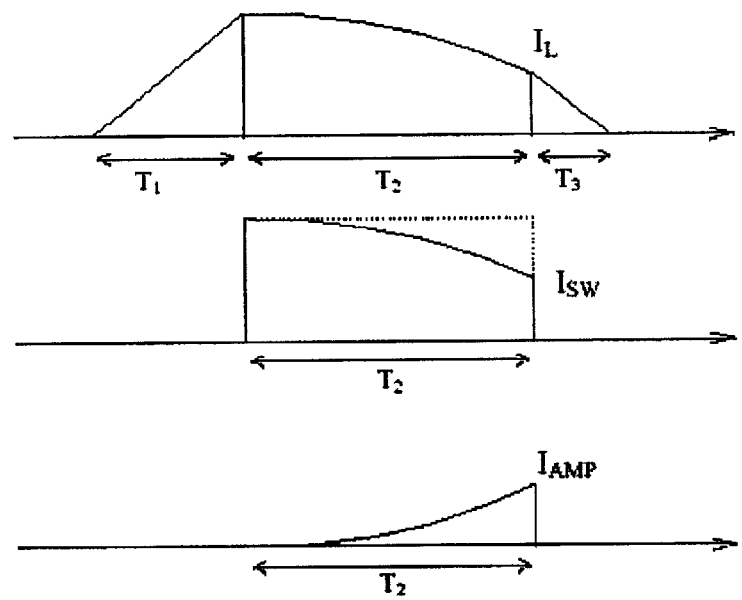
FIG. 10 is a comparative plot of voltage and current signals appearing in the circuit according to an embodiment of the invention.

FIG. 10 shows comparative plots of the current L in the inductor 16, the output current $I_{SW}$ from the switching circuit portion 13, and the output current $I_{AMP}$ from the amplifier, in relation to the three phases T1, T2 and T3 just described. As can be evinced from these plots, only a fraction of the load current comes from the linear portion 12, the rest of the current being released from the switching portion 13 in a theoretically non-dissipative manner. It should be noted that, by suitably dimensioning the transistors of the switching circuit portion 13, their dissipation can be made trivial during the conduction phase.

Figure 11:
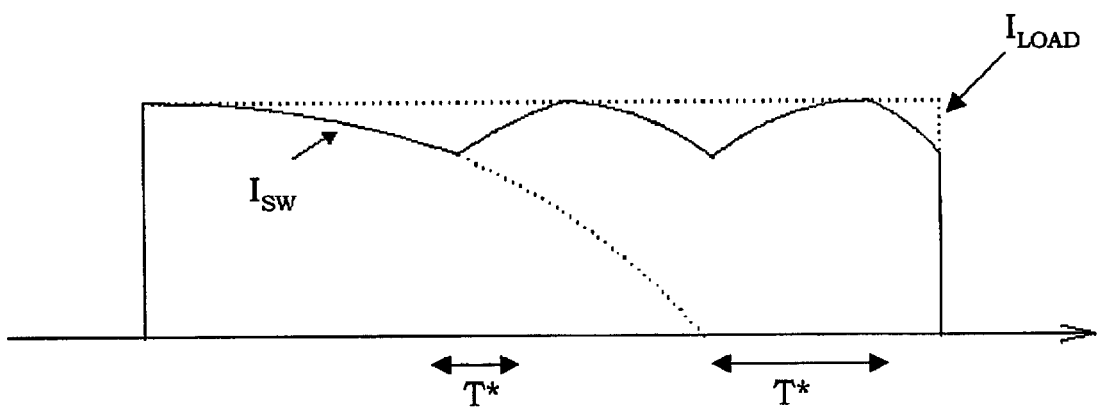
FIG. 11 is a plot of current vs. time relating to time periods when the circuit according to an embodiment of the invention.

To enhance the efficiency of the system, thereby improving the accuracy of the switching circuit portion 13 in approaching the current profile demanded by the load, during the phase T2 above, a corrective action can be applied to prevent decay of the current released through the inductor 16. This is achieved by keeping the transistor M1 closed for suitably selected time periods, shown at T* in FIG. 11. In this way, the value of the current released to the load through the inductor 16 can be sustained, thereby to reduce the amount of current to be sustained by the linear portion 12, more dissipative. The time periods T* can be controlled by either calculating the evolvement of the current in the inductor 16 with time, or more simply by utilizing a feedback variable.

Figure 12:
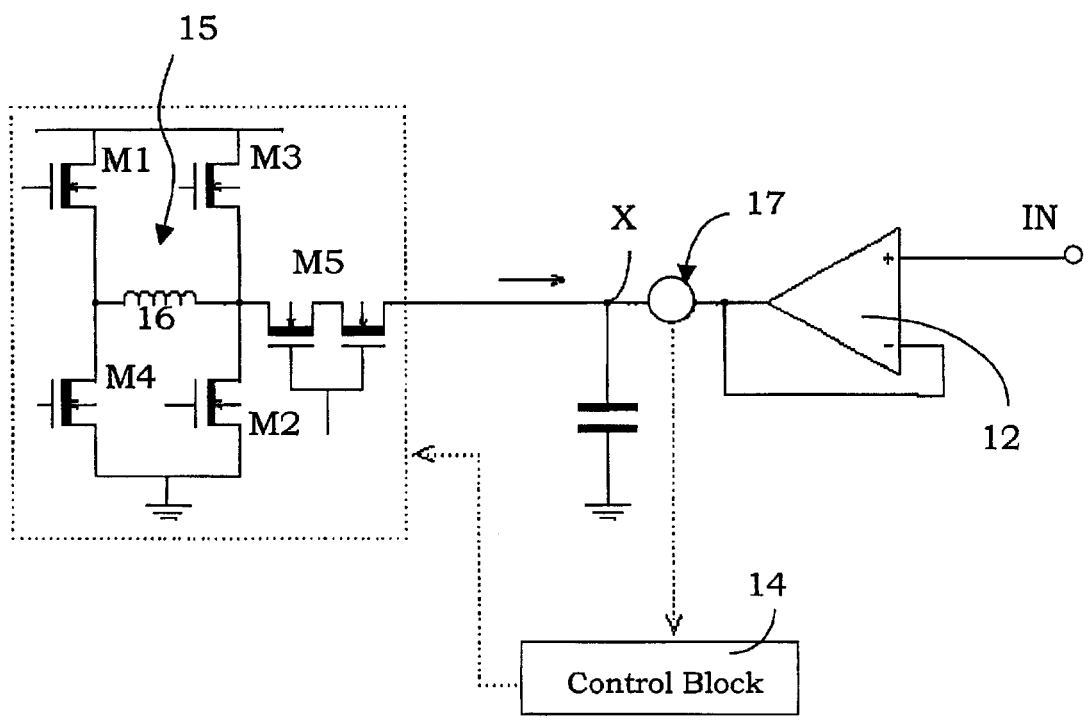
FIG. 12 shows schematically a modification of the circuit in FIG. 4.

As a schematic example, the diagram of FIG. 12 represents a modification of the circuit 10 where the output current $I_{AMP}$ from the linear portion 12 is used as the feedback variable. The control block 14 comprises basically a logic interface coupled to a current sensor 17, and a digital technology logic network having analog output stages connected to the control terminals of the bridge circuit transistors and the switch M5. The sensor 17 is provided downstream of the linear portion 12 and upstream of the node X, and is connected to the control block 14 to have the value of the current $I_{AMP}$ assessed. Based on the value of the current $I_{AMP}$, the bridge 15, specifically transistor M1 during the voltage upward ramp or transistor M4 during the downward voltage ramp, is switched over.

The feedback variable may be controlled in any of several ways. For example, transistor M1 may be closed at predetermined times, and opened again upon the current $I_{AMP}$ crossing a predetermined threshold. A different form of control provides for the use of hysteresis. For example, as the output current from the linear portion 12 exceeds a suitable threshold $I_{HIGH}$, transistor M1 (or alternatively, transistor M4 during the downward ramp) is kept closed until said current reaches a lower threshold $I_{LOW}$ at which the transistor M1 (or M4) is opened. In this way, the hysteresis type of control will be: $I_{HYST}=I_{HIGH}-I_{LOW}$.

Figure 13:
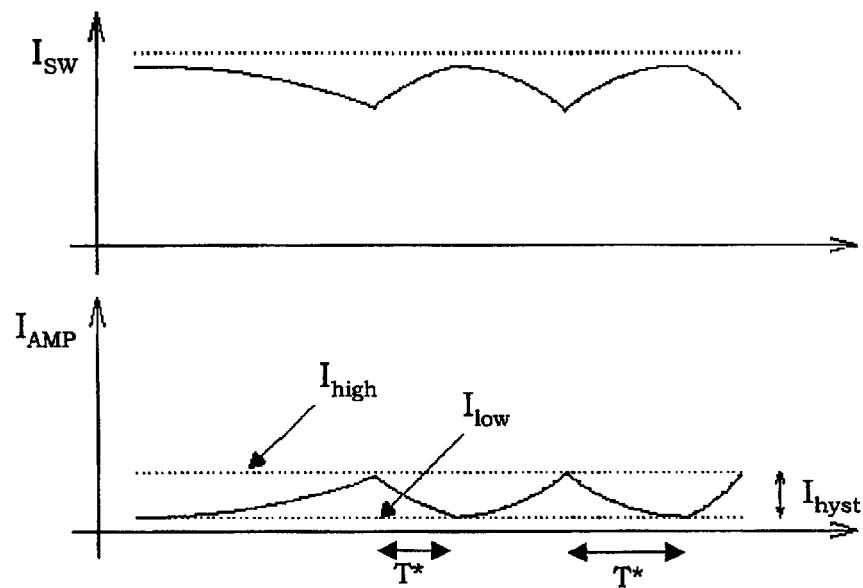
FIG. 13 is a plot of current vs. time for signals appearing in the circuit of FIG. 12.

The type of control and the corresponding waveforms are shown in FIG. 13 for a predetermined time period denoted by T2. The value of the current $I_{HYST}$ will be a compromise choice, a small value involving fast switching of the half-bridge circuit legs, whereas a large value may lead to increased dissipation by the linear portion 12.

Figure 14:
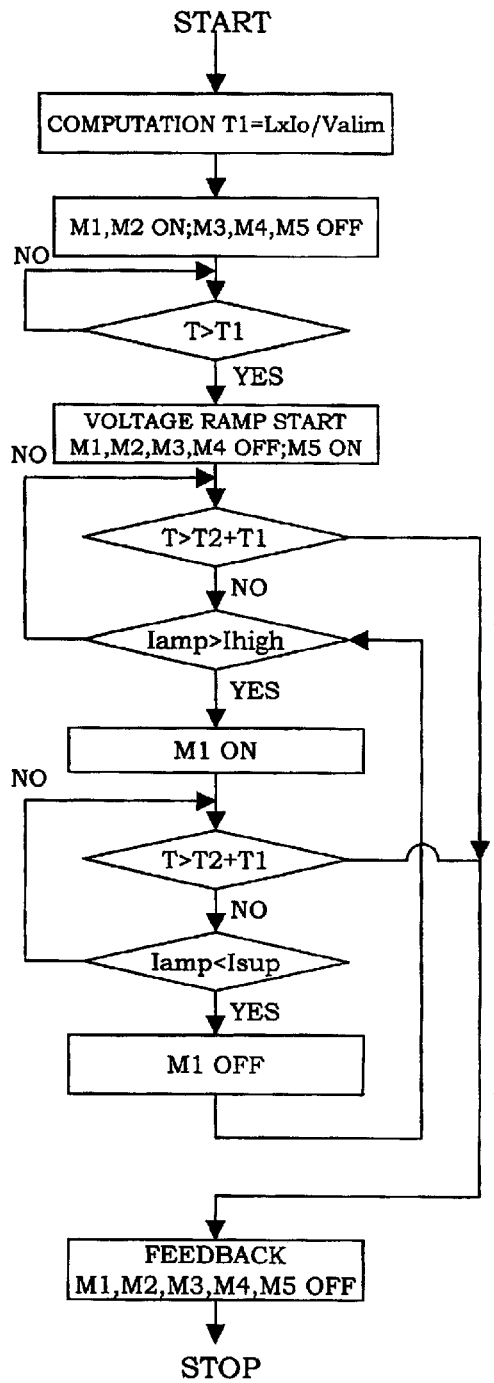
FIGS. 14 and 15 are respective flow charts illustrating schematically a hysteresis type of control for the circuit according to an embodiment of the invention.
Figure 15:
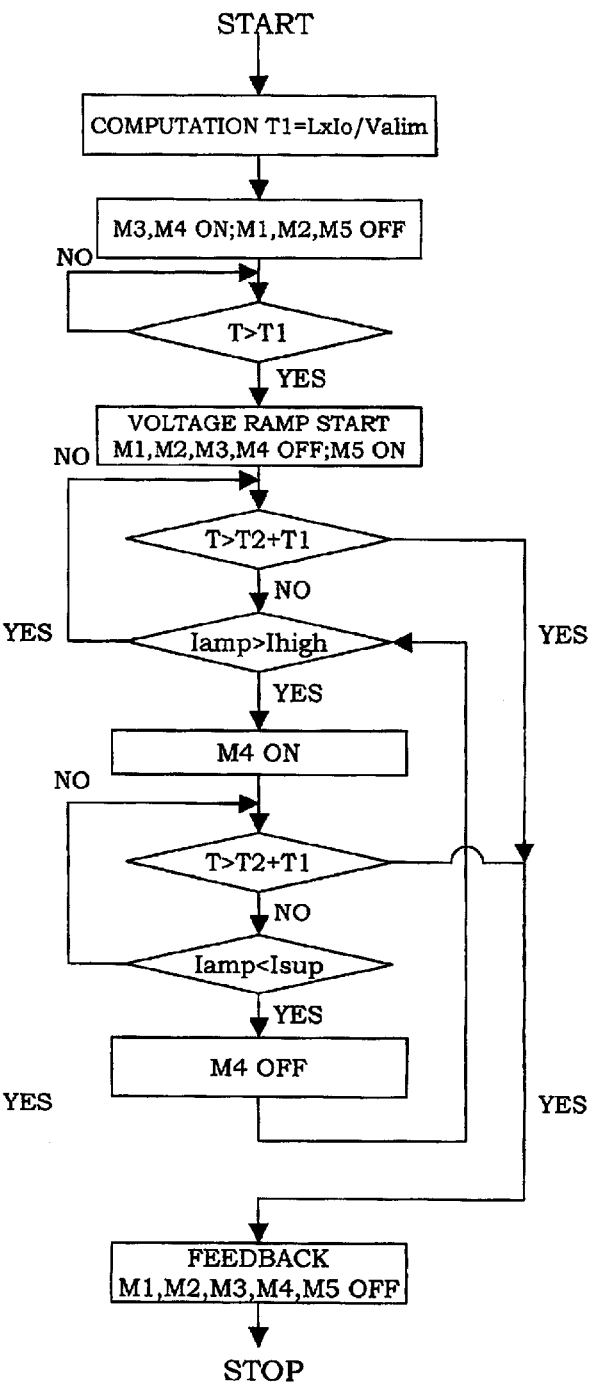

Shown in FIGS. 14 and 15 are respective flow charts illustrating in schematic form the hysteresis type of control, as relating to an upward ramp and a downward ramp, respectively. It should be noted that using a single driver circuit 10, as described hereinabove and shown in the drawings, will be adequate only when the time interval between any two adjacent ramps can produce a current loop-back through the diodes at the end of the first ramp and pre-charge the inductor 16 to a required current value before the next ramp begins. If the above condition fails to occur, the switching circuit portion 13 must be duplicated to provide a bridge circuit B1 effective to inject a current during the upward ramps, as shown schematically in FIG. 16.

Figure 16:
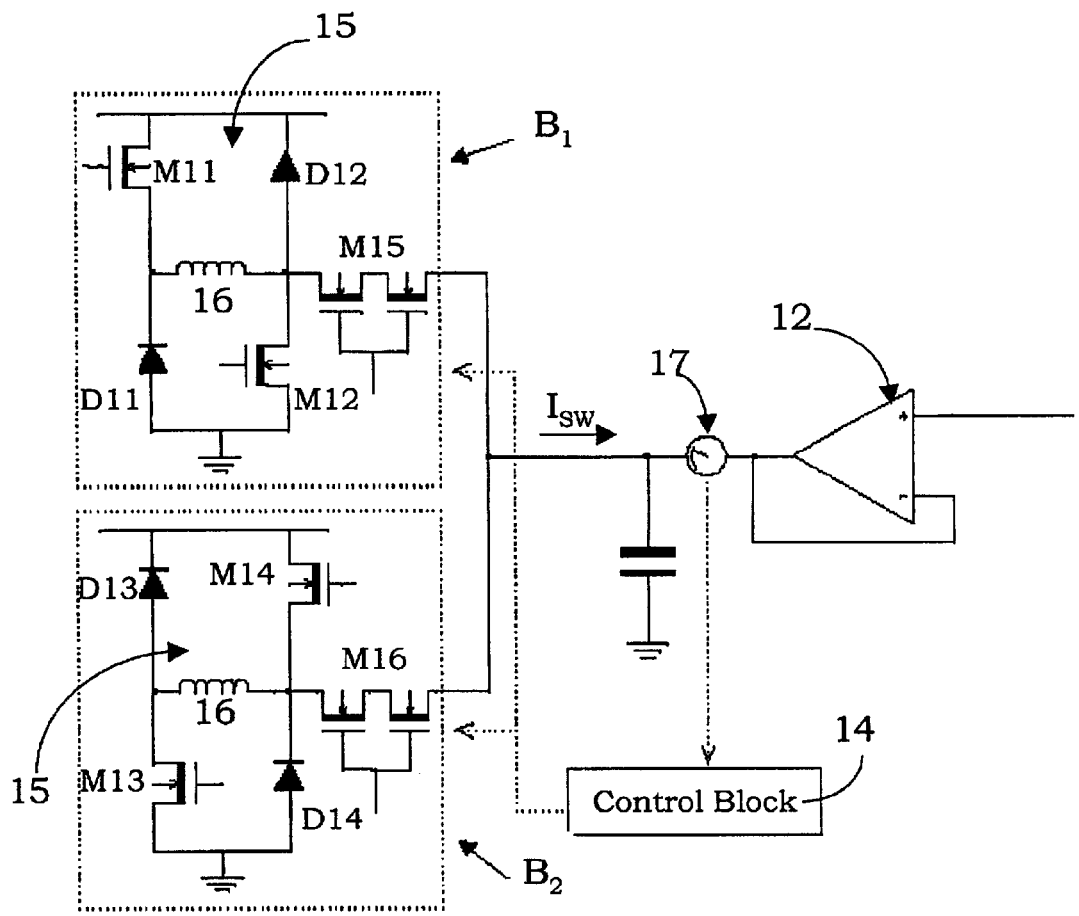
FIG. 16 shows schematically an exemplary application of the circuit according to an embodiment of the invention.

Also, represented in FIG. 16 is a modified embodiment where diodes D11, D12 in bridge B1 and D13, D14 in bridge B2 are substituted for two transistors in each of the bridge circuits B1 and B2. The last-mentioned embodiment can make for much easier control of the current loop-back phase. Thus, the above-described circuit solves the technical problem and offers a number of advantages, foremost among which is the fact that the capacitive load 11 can be driven with high efficiency without debasing the quality of the waveform generated across the load.

While embodiments of the invention have been illustrated and described, it will be appreciated that various changes can be made therein without departing from the spirit and scope of the invention.

The embodiments of the invention in which an exclusive property or privilege is claimed are defined as follows:

1. An electronic system comprising:
    a) a linear electronic circuit for applying a voltage waveform to a capacitive load;
    b) a switching circuit connected to the capacitive load for supplying a fraction of current demanded by the capacitive load; and
    c) a control circuit for controlling the switching circuit.

2. The electronic system of claim 1, wherein said switching circuit comprises a transistor bridge powered between a first voltage reference and a second voltage reference.

3. An electronic system comprising:
    a) an electronic circuit for applying a voltage waveform to a capacitive load;
    b) a switching circuit connected to the capacitive load for supplying a fraction of current demanded by the capacitive load;
    c) a control circuit for controlling the switching circuit;
    d) wherein said switching circuit comprises a transistor bridge powered between a first voltage reference and a second voltage reference; and
    e) an inductor connected between two opposed nodes of said bridge circuit.

4. An electronic system comprising:
    a) an electronic circuit for applying a voltage waveform to a capacitive load;
    b) a switching circuit connected to the capacitive load for supplying a fraction of current demanded by the capacitive load;
    c) a control circuit for controlling the switching circuit;
    d) wherein said switching circuit comprises a transistor bridge powered between a first voltage reference and a second voltage reference; and
    e) wherein said bridge circuit is coupled to the load through a two-way switch.

5. The electronic system of claim 4, wherein control terminals of the transistors in the bridge circuit are all connected to outputs of the control circuit, said control circuit having an output connected to the switch.

6. An electronic system comprising:
    a) an electronic circuit for applying a voltage waveform to a capacitive load;
    b) a switching circuit connected to the capacitive load for supplying a fraction of current demanded by the capacitive load;
    c) a control circuit for controlling the switching circuit;
    d) wherein said switching circuit comprises a transistor bridge powered between a first voltage reference and a second voltage reference; and
    e) a current sensor connected in downstream of said linear portion and connected to said control circuit.

7. The electronic system of claim 2, wherein said bridge circuit comprises diodes and transistors.

8. An electronic system comprising:
    a) an electronic circuit for applying a voltage waveform to a capacitive load;
    b) a switching circuit connected to the capacitive load for supplying a fraction of current demanded by the capacitive load;
    c) a control circuit for controlling the switching circuit;
    d) wherein said switching circuit comprises a transistor bridge powered between a first voltage reference and a second voltage reference; and
    e) an additional bridge circuit configured to draw current from the capacitive load during the downward ramps of said voltage waveform.

9. A method for supplying current to a capacitive load, the method comprising:
    a) supplying an amount of current to the capacitive load by generating a voltage waveform from a linear electronic driving circuit connected to the capacitive load;
    b) supplying an amount of current to the capacitive load by generating a voltage waveform from a switching circuit connected to the capacitive load; and
    c) switching the switching circuit using a control circuit, the control circuit optimally switching said switching circuit to supply current to the capacitive load.

10. The method of claim 9, wherein optimally switching said switching circuit further comprises:
    a) charging an inductor in the switching circuit for an amount of time before connecting the switching circuit to the capacitive load;
    b) supplying an amount of current stored in the charged inductor to the capacitive load for an amount of time before redirecting current stored in the charged inductor;
    c) redirecting a remaining amount of current stored in the charged inductor by disconnecting the switching circuit from the capacitive load.

11. The method of claim 10 wherein the amount of time before connecting the switching circuit to the capacitive load is long enough to charge the inductor to supply an amount of current from the switching circuit equal to the current demanded by the capacitive load.

12. A method for supplying current to a capacitive load, the method comprising:
    a) supplying an amount of current to the capacitive load by generating a voltage waveform from an electronic driving circuit connected to the capacitive load;

b) supplying an amount of current to the capacitive load by generating a voltage waveform from a switching circuit connected to the capacitive load;

c) switching the switching circuit using a control circuit, the control circuit optimally switching said switching circuit to supply current to the capacitive load;

d) wherein optimally switching said switching circuit comprises, e) charging an inductor in the switching circuit for an amount of time before connecting the switching circuit to the capacitive load, f) supplying an amount of current stored in the charged inductor to the capacitive load for an amount of time before redirecting current stored in the charged inductor, g) redirecting a remaining amount of current stored in the charged inductor by disconnecting the switching circuit from the capacitive load; and h) engaging the switching circuit to avoid decaying current in the charged inductor when the difference between the current demanded by the capacitive load and the current supplied by the driving circuit exceeds a high threshold current.

13. A method for supplying current to a capacitive load, the method comprising:

a) supplying an amount of current to the capacitive load through a linear electronic driving circuit connected to the capacitive load;

b) supplying a decaying amount of current to the capacitive load through a switching circuit connected to the capacitive load; and c) switching the switching circuit using a control circuit, the control circuit optimally switching said switching circuit to supply current to the capacitive load.

14. The method of claim 13 wherein the amount of time before connecting the switching circuit to the capacitive load is long enough to charge an inductor to supply a decaying amount of current from the switching circuit equal to the current demanded by the capacitive load.

15. A method for supplying current to a capacitive load, the method comprising:

a) supplying a linear amount of current to the capacitive load through an electronic driving circuit connected to the capacitive load;

b) supplying a decaying amount of current to the capacitive load through a switching circuit connected to the capacitive load;

c) switching the switching circuit using a control circuit, the control circuit optimally switching said switching circuit to supply current to the capacitive load; and d) engaging the switching circuit to avoid decaying current in the inductor when the difference between the current demanded by the capacitive load and the decaying current supplied by the switching circuit exceeds a high threshold current.

16. A method for supplying current to a capacitive load, the method comprising:

a) supplying a linear amount of current to the capacitive load through an electronic driving circuit connected to the capacitive load;

b) supplying a decaying amount of current to the capacitive load through a switching circuit connected to the capacitive load;

c) switching the switching circuit using a control circuit, the control circuit optimally switching said switching circuit to supply current to the capacitive load; and d) the amount of time before disconnecting the switching circuit from the capacitive load is long enough to deliver a decaying amount of current at least equal to the difference between a high threshold current and the linear amount supplied by the driver circuit.

17. A high-efficiency driver circuit for capacitive loads, which circuit comprises a linear drive portion connected to at least one end of a capacitive electric load being applied a voltage waveform, wherein the driver circuit further comprises a switching circuit portion having its output connected to said one end of the capacitive load to supply a fraction of the overall current demanded by the load.

18. A circuit according to claim 17, where the circuit comprises a control block for driving the switching circuit portion.

19. A circuit according to claim 17, wherein said switching circuit portion comprises a transistor bridge being powered between a first or supply voltage reference and a second or ground reference.

20. A high-efficiency driver circuit for capacitive loads, which circuit comprises a drive portion connected to at least one end of a capacitive electric load being applied a voltage waveform, wherein the driver circuit further comprises a switching circuit portion having its output connected to said one end of the capacitive load to supply a fraction of the overall current demanded by the load, wherein said switching circuit portion comprises a transistor bridge being powered between a first or supply voltage reference and a second or ground reference, and wherein an inductor is connected between two opposed nodes of said bridge circuit.

21. A high-efficiency driver circuit for capacitive loads, which circuit comprises a drive portion connected to at least one end of a capacitive electric load being applied a voltage waveform, wherein the driver circuit further comprises a switching circuit portion having its output connected to said one end of the capacitive load to supply a fraction of the overall current demanded by the load, wherein said switching circuit portion comprises a transistor bridge being powered between a first or supply voltage reference and a second or around reference, and wherein said bridge circuit is coupled to the load through a two-way switch.

22. A circuit according to claim 21, wherein the control terminals of the transistors in the bridge circuit are all connected to outputs of the control block, said control block also having an output connected to the switch.

23. A high-efficiency driver circuit for capacitive loads, which circuit comprises a drive portion connected to at least one end of a capacitive electric load being applied a voltage waveform, wherein the driver circuit further comprises a switching circuit portion having its output connected to said one end of the capacitive load to supply a fraction of the overall current demanded by the load, wherein the driver circuit comprises a control block for driving the switching circuit portion, and wherein the driver circuit comprises a current sensor connected downstream of said linear portion and connected to said control block.

24. A circuit according to claim 19, wherein said bridge circuit comprises diodes and transistors.

25. A high-efficiency driver circuit for capacitive loads, which circuit comprises a drive portion connected to at least one end of a capacitive electric load being applied a voltage waveform, wherein the driver circuit further comprises a switching circuit portion having its output connected to said one end of the capacitive load to supply a fraction of the overall current demanded by the load, wherein said switching circuit portion comprises a transistor bridge being powered between a first or supply voltage reference and a second or around reference, and wherein the driver circuit comprises an additional bridge circuit effective to draw current from the load during the downward ramps of said waveform.

26. A circuit for driving a capacitive load, the circuit comprising:
   a linear driver operable to provide a first drive current to the load; and
   a switching driver operable to provide a second drive current to the load at the same time that the linear driver provides the first drive current to the load.

27. The circuit of claim 26 wherein the linear driver is further operable to cause a voltage across the load to change at a predetermined rate.

28. The circuit of claim 26 wherein the linear driver is further operable to cause a voltage across the load to change at a predetermined constant rate.

29. The circuit of claim 26 wherein the linear driver is further operable to cause an edge of a voltage waveform across the load to have a predetermined slope.

30. The circuit of claim 26 wherein the linear driver is further operable to cause an edge of a voltage waveform across the load to have a predetermined constant slope.

31. The circuit of claim 26 wherein the switching driver comprises an inductor and is further operable to cause the inductor to provide the second drive current to the load.

32. The circuit of claim 26 wherein the switching driver is operable to adjust a level of the second current in response to a level of the first current.

33. A method for driving a capacitive load, the method comprising:
   linearly amplifying a first input signal to generate a first drive signal;
   switching a second input signal to generate a second drive signal; and
   simultaneously coupling the first and second drive signals to the load.

34. The method of claim 33 wherein:
   the first input signal comprises an input voltage;
   the first drive signal comprises a drive voltage;
   the second input signal comprises a supply voltage; and
   the second drive signal comprises a drive current.

35. The method of claim 33 wherein switching the second input signal comprises switching the second input signal across an inductor.

* * * * *

UNITED STATES PATENT AND TRADEMARK OFFICE
CERTIFICATE OF CORRECTION

PATENT NO. : 6,828,712 B2
DATED : December 7, 2004
INVENTOR(S) : Luca Battaglin et al.

It is certified that error appears in the above-identified patent and that said Letters Patent is hereby corrected as shown below:

Column 8,
Line 40, please replace "around" with -- ground --.

Column 9,
Line 1, please replace "around" with -- ground --.

Signed and Sealed this

Twelfth Day of July, 2005

JON W. DUDAS
*Director of the United States Patent and Trademark Office*